United States Patent
Guan et al.

(10) Patent No.: US 8,466,510 B2
(45) Date of Patent: Jun. 18, 2013

(54) STAGGERED COLUMN SUPERJUNCTION

(75) Inventors: Lingpeng Guan, Sunnyvale, CA (US);
Madhur Bobde, San Jose, CA (US);
Anup Bhalla, Santa Clara, CA (US);
Hamza Yilmaz, Saratoga, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 681 days.

(21) Appl. No.: 12/610,052

(22) Filed: Oct. 30, 2009

(65) Prior Publication Data
US 2011/0101446 A1     May 5, 2011

(51) Int. Cl.
*H01L 29/78*    (2006.01)
(52) U.S. Cl.
USPC ............ 257/329; 257/E21.418; 257/E29.257; 257/341; 438/268
(58) Field of Classification Search
USPC ........................................................ 257/335
See application file for complete search history.

(56) References Cited

U.S. PATENT DOCUMENTS

| | | | |
|---|---|---|---|
| 6,300,171 B1 * | 10/2001 | Frisina | 438/140 |
| 2006/0043480 A1 * | 3/2006 | Tsuchitani et al. | 257/341 |
| 2006/0151831 A1 | 7/2006 | Ninomiya et al. | |
| 2007/0272979 A1 * | 11/2007 | Saito et al. | 257/335 |
| 2009/0079002 A1 | 3/2009 | Lee et al. | |

* cited by examiner

*Primary Examiner* — David Vu
*Assistant Examiner* — Jonathan Han
(74) *Attorney, Agent, or Firm* — Joshua D. Isenberg; JDI Patent

(57) ABSTRACT

A staggered column superjunction semiconductor device may include a cell region having one or more device cells. One or more device cells in the cell region include a semiconductor substrate configured to act as a drain and a semiconductor layer formed on the substrate. A first doped column may be formed in the semiconductor layer to a first depth and a second doped column may be formed in the semiconductor layer to a second depth. The first depth is greater than the second depth. The first and second columns are doped with dopants of a same second conductivity type and extend along a portion of a thickness of the semiconductor layer and are separated from each by a portion of the semiconductor layer.

11 Claims, 16 Drawing Sheets

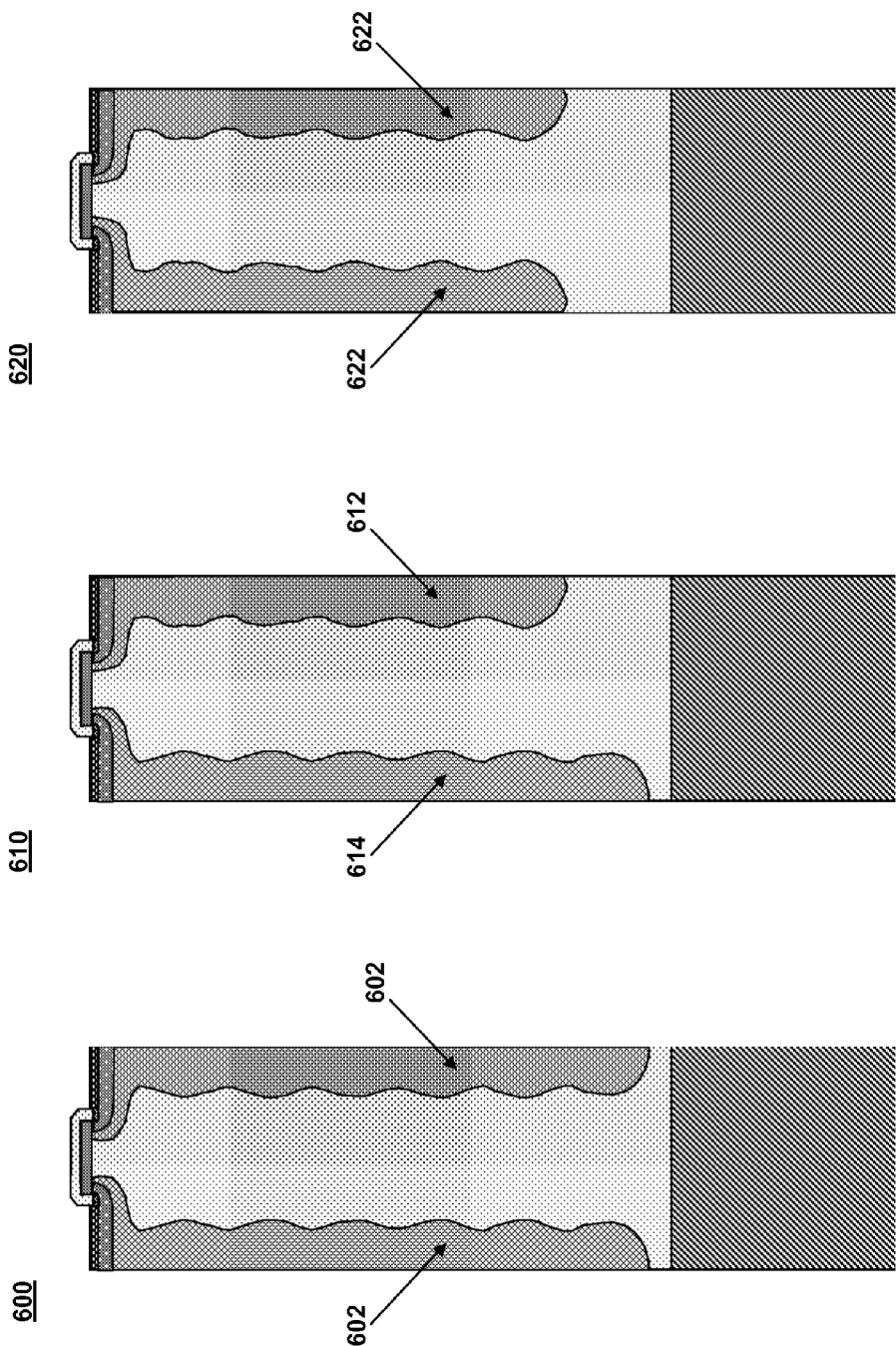

STAGGERED COLUMN SUPERJUNCTION

FIELD OF THE INVENTION

This invention generally relates to metal oxide semiconductor field effect transistors (MOSFETs) and more particularly to staggered superjunction devices and a process for their manufacture.

BACKGROUND OF THE INVENTION

Power MOSFETs have typically been developed for applications requiring power switching and power amplification. For power switching applications, the commercially available devices are typically double diffused MOSFETs (DMOSFETs). In a typical transistor, much of the breakdown voltage BV is supported by a drift region, which is lowly doped in order to provide a higher breakdown voltage BV. However, the lowly doped drift region also produces high on-resistance $R_{ds\text{-}on}$. For a typical transistor, $R_{ds\text{-}on}$ is proportional to $BV^{2.5}$. $R_{ds\text{-}on}$ therefore increases dramatically with increase in breakdown voltage BV for a conventional transistor.

Superjunctions are a well known type of semiconductor device. Superjunction transistors provide a way to achieve low on-resistance ($R_{ds\text{-}on}$), while maintaining a high off-state breakdown voltage (BV). Superjunction devices include alternating P-type and N-type doped columns formed in the drift region. In the OFF-state of the MOSFET, the columns completely deplete at relatively low voltage and thus can sustain a high breakdown voltage (the columns deplete laterally, so that the entire p and n columns are depleted). For a superjunction, the on-resistance $R_{ds\text{-}on}$ increases in direct proportion to the breakdown voltage BV, which is a much less dramatic increase than in the conventional semiconductor structure. A superjunction device may therefore have significantly lower $R_{ds\text{-}on}$ than a conventional MOSFET device for the same high breakdown voltage (BV) (or conversely may have a significantly higher BV than a conventional MOSFET for a given $R_{ds\text{-}on}$).

Unclamped Inductive Switching (UIS) is a context sensitive term used to describe a Power MOSFET's ability to sustain current in the avalanche mode (a condition when the drain-source voltage exceeds the bulk break down of the Power MOSFET) without permanent damage. The UIS is a figure commonly used to measure the robustness of a MOSFET. One of the key points to achieving a high UIS is ensuring that the termination regions of the MOSFET do not break down before the active cell regions do. The active cell regions cover much larger area than the termination region and so can tolerate a much larger avalanche current than the termination regions. In conventional superjunction devices, unstable UIS caused by process variation or lower termination or corner region BV may exist. Furthermore, when many superjunction devices are formed in a common wafer, $R_{ds\text{-}on}$ and BV may vary across due to process variation across the wafer.

It is within this context that embodiments of the present invention arise.

SUMMARY

Certain embodiments of the present invention are directed to a staggered column vertical superjunction semiconductor device that includes an active cell region with one or more device cells. Each of the device cells in the active cell (or main) region includes a first semiconductor layer, e.g., a semiconductor substrate, of a first conductivity type. A second semiconductor layer, e.g., an epitaxial layer, of the first conductivity type is located on top of the substrate. A first doped column is formed in the second semiconductor layer to a first depth and a second doped column formed in the second semiconductor layer to a second depth. The first depth is one unit of depth greater than the second depth. The first and second columns are doped with dopants of a second conductivity type and extend along a portion of a thickness of the second semiconductor layer. The first and second columns are separated from each by a portion of the second semiconductor layer that acts as a drift region. Other embodiments of the present invention are directed to making one of the columns of a second conductivity type within the main portion of the device have less depth than the depth of the columns of the second conductivity type in a termination portion of the device.

Certain other embodiments of the present invention are directed to a method of manufacturing a staggered column superjunction semiconductor device. According to the method a first mask may be applied to a surface of a first semiconductor layer doped with dopants having a first conductivity type. The first mask is patterned with openings positioned at locations corresponding to a first column and no openings at locations corresponding to a second column. Dopants having a second conductivity type may be implanted through the openings to form first implanted regions. A second semiconductor layer may be grown on top of the first semiconductor layer and doped with dopants of the first conductivity type. A second mask may be applied on the surface of the second semiconductor layer. The second mask is patterned with openings positioned at locations corresponding to the first and second columns. Dopants of the second conductivity type may be implanted into the second semiconductor layer through the openings positioned at locations corresponding to the first and second columns to form the second implanted regions. This process may be repeated until a desired height (or depth) of the columns is achieved. Then the dopants of second conductivity type may be diffused to form the columns of second conductivity type separated by drift regions of first conductivity type. The columns of the second conductivity type may be doped to a sufficient extent that they horizontally charge balanced with adjacent drift regions of the first conductivity type. However since the second column does not extend as deeply as the first column, the area below the second columns is not fully charge balanced, which alters the BV and $R_{ds\text{-}on}$ characteristics.

BRIEF DESCRIPTION OF THE DRAWINGS

Other objects and advantages of the invention will become apparent upon reading the following detailed description and upon reference to the accompanying drawings in which:

FIGS. 6A-6C are cross-sectional views illustrating three different types superjunction MOSFET.

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

Introduction

Figure 1:
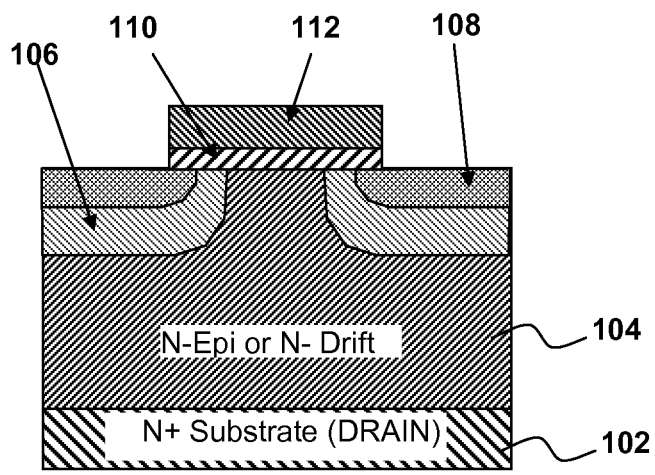
FIG. 1 is a cross-sectional view of a MOSFET device of the prior art.

FIG. 1 is a cross-sectional view for a single cell 100 of a typical conventional vertical DMOS field effect transistor (FET) device. A DMOS FET typically includes a large number of such cells. The vertical FET structure (N-channel in this example) of the cell 100 is formed on an N+ substrate 102, which acts as a drain region. An N-Epitaxial (epi) or N-drift 104 is located on top of the substrate 102. The structure 100 also includes a P-body region 106, an N+ source region 108, an N+ polysilicon gate region 112 and a gate oxide 110 disposed under the N+ polysilicon gate 112. However, the design of such a device involves a trade off between low on resistance (resistance between the drain and the source when the gate is on) versus high breakdown voltage (the voltage between the source and the drain at breakdown when the gate is off), often related to the concentration and thickness of the drift region 104.

Figure 2:
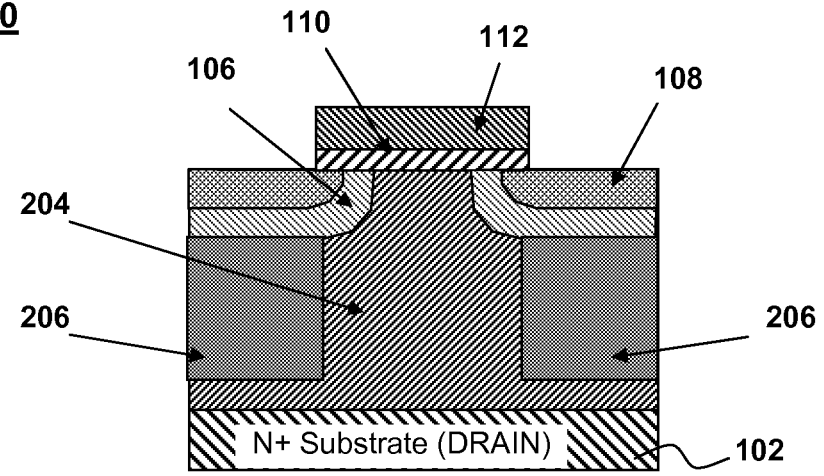
FIG. 2 is cross-sectional view of a superjunction MOSFET device of the prior art.

FIG. 2 is a cross-sectional view for a single cell 200 of a superjunction DMOS field effect transistor (FET) device. The vertical FET structure of the cell 200 is formed on an N+ substrate 102, which acts as a drain region. However, in a super junction transistor, alternating columns of P-type 206 and N-type 204 are used in place of the standard drift region. The N-type column 204 may be formed from the portions of N-epitaxial layer found adjacent to the P-type columns 206. Similar to structure 100, the structure 200 also includes a P-body region 106, an N+ source region 108, an N+ polysilicon gate region 112 and a gate oxide 110 disposed under the polysilicon gate 112.

The alternating columns 204 and 206 are sized and doped such that their charges balance out horizontally with the adjacent columns. When the MOSFET is in the ON-state, the N-type column 204 allows a drift current flow vertically. The concentrations of the columns can be made much higher than that of the drift region for a typical transistor, which means that during the on-state, the columns can conduct with a lower on-resistance. In the OFF-state, with the gate switched off, a voltage difference arises between the P-type columns 206 (tied to the source voltage), and the N-type column 204 (tied to drain voltage) which causes the columns to deplete each other horizontally, and thus greatly increase the breakdown voltage of the device.

Reducing the depth of the N-type column 204 (shortening the current path in the N-type column 204) is effective for reducing the on-resistance of the MOSFET, since the drift path (and resistance) is lowered in the ON-state of the device. However, the short depth of N-type column 204 causes OFF-state breakdown at a lower voltage, since there is not as much depleted area and the electric field strength in the depletion layers soon reaches the maximum (critical) value for silicon. However, in a semiconductor device with a high breakdown voltage, a deeper N-type column 204 tends to increase $R_{ds\text{-}on}$. Thus, there still exists a tradeoff relation between the on-resistance and the breakdown voltage of the MOSFET, but as explained above, this tradeoff is much more favorable than for a conventional DMOS FET. With a superjunction the $R_{ds\text{-}on}$ is roughly directly proportional to the BV. The breakdown voltage is sustained by the depletion layers expanding from the PN-junctions between P-type columns 206 and N-type columns 204. With complete charge balance, the columns will completely deplete horizontally. The breakdown voltage increases as the N-type columns 204 and P-type columns 206 are made deeper.

Superjunction devices of the type show in FIG. 2 may be mass produced using a multi-layer, e.g., six-layer, sequence of epitaxy and implant to form spaced P-columns which are used to balance the charge in an epitaxial N-type drift region in which the P-columns are formed. Ions are implanted into each successive epitaxial layer through an implant mask. The same mask is typically used repetitively for implantation of each of the epitaxial layers to generate the P-columns.

Superjunction structures (e.g., selectively doped columns) may be used for both active device cells and termination regions in a transistor device die. It is often desirable to have higher breakdown voltage in the termination regions than in the active device cells. It is preferred for breakdown to occur in the active device cells rather than in the termination region since the breakdown current can be spread over a much larger area thereby minimizing damage. However process variations may sometimes cause the BV in the termination region to be lower than in the active device cells. Also it is desirable to have as high a breakdown voltage and as low an $R_{ds\text{-}on}$ as possible. For the reasons discussed above these are conflicting requirements. Satisfying these requirements with a conventional superjunction structure would involve making the columns deeper in the termination region and shallower in the active device cells.

A practical solution to this problem is a superjunction device with staggered column depths according to embodiments of the invention.

Superjunction Device with Staggered Column Depths

Figure 3A:
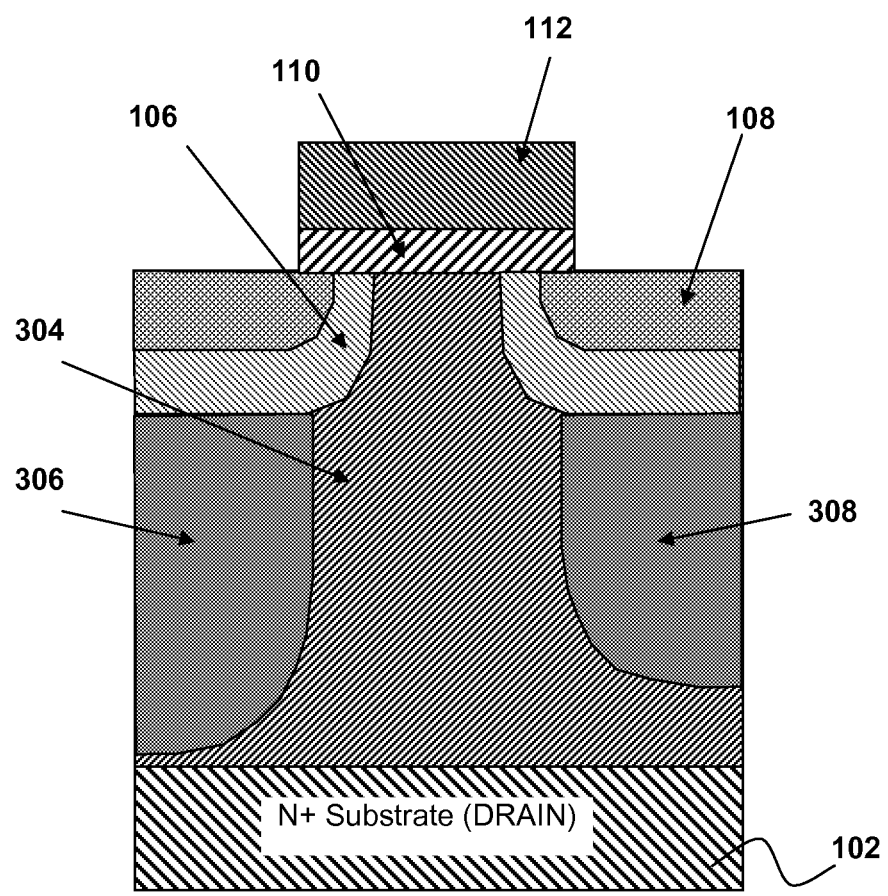
FIG. 3A is cross-sectional view of a superjunction MOSFET device according to an embodiment of the present invention.

FIG. 3A is a cross-sectional view for a single cell 300 of a staggered column superjunction DMOS field effect transistor (FET) device. Similarly to the structure of the cell 200, cell 300 is formed on an N+ substrate 102, which acts as a drain region, and has a P-body region 106, an N+ source region 108, a N+ polysilicon gate region 112 and a gate oxide 110 disposed under the N+ gate 112. The cell 300 includes alternating columns of P-type 306, 308 and N-type 304 used in place of the standard drift region. The N-type columns 304 may comprise regions of the N-type epitaxial layer that are situated adjacent to the P-type columns 306, 308. The alternating columns 304, 306 and 308 are sized and doped such that their charges largely balance out horizontally with the adjacent columns. N-type columns 304 work as regions for making a drift current flow vertically when the MOSFET is in the ON-state. The concentrations of the columns can be made much higher than that of the drift region for a typical transistor, so that during the on-state, they can conduct with a lower on-resistance.

Figure 3B:
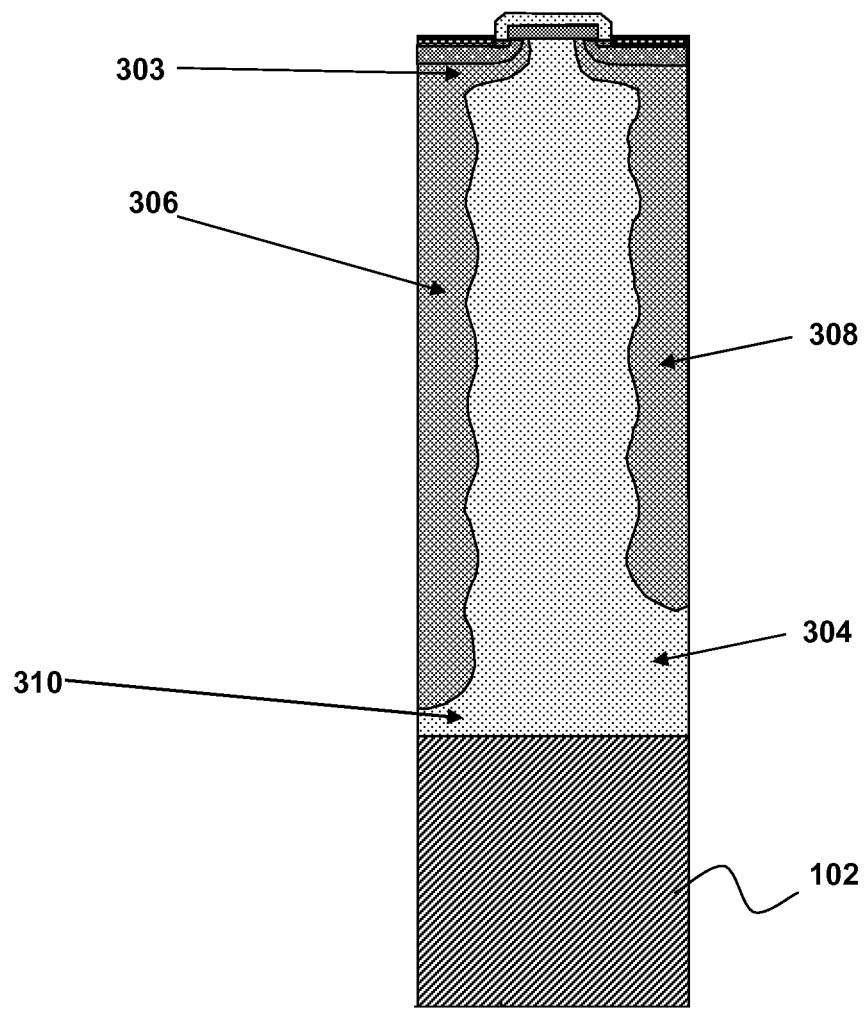
FIG. 3B is a cross-sectional view of a superjunction structure of the superjunction MOSFET device of the type depicted in FIG. 3A.

In certain embodiments of the current invention, some of the P columns 306, 308 have staggered, i.e., different depths. FIG. 3B is a cross-sectional view of an example of a staggered column superjunction structure 320 of the type depicted in FIG. 3A. As shown in FIG. 3B, the P columns 308 are 6 units deep, and the P columns 306 may be 7 units deep. By way of example, and not by way of limitation, a unit may be 5-15 microns (μm), more specifically, 6-7 μm. Optionally, a buffer 310 can be formed in the space between the substrate 102 and the P column 306. A suitable design, e.g., a buffer 310 5-15 nm thick, can improve the BV, process window, and UIS performance. By way of example and not by way of limitation, the buffer 310 can be made of N-type Silicon. Alternatively, the P column 306 may extend all the way down to the substrate 102. Due to the stagger or non-symmetry of the superjunction structure the area of N-type column 304 adjacent to the bottom of P-type column 308, which are only 6 units deep, will not completely deplete, thereby reducing the breakdown voltage BV but also reducing $R_{ds\text{-}on}$.

A source and gate for a MOSFET can be formed at the top of the columns 306, 308 using a standard process. Alternatively, the topmost layer may optionally not be implanted while forming the P-type columns, leaving only 6 units depth for the P column 306 and 5 units depth for the P column 308, as long as the body regions 303 of the MOSFET extends deep enough to contact the top of the P column 306, 308.

The BV in a termination area (typically near the edge of a device) tends to be lower because of curvature of the device and the electric field, which leads to higher electric fields and correspondingly lower BV. By adjusting the stagger of the P columns in different areas of the device, the breakdown voltage may be decreased slightly in the active area (the middle of the device), where a lower $R_{ds\text{-}on}$ is desirable, while maintaining a high breakdown voltage in the termination area (where all the P columns may be formed to a full 7 units of depth).

Device with Staggered and Conventional Superjunctions

Figure 4A:
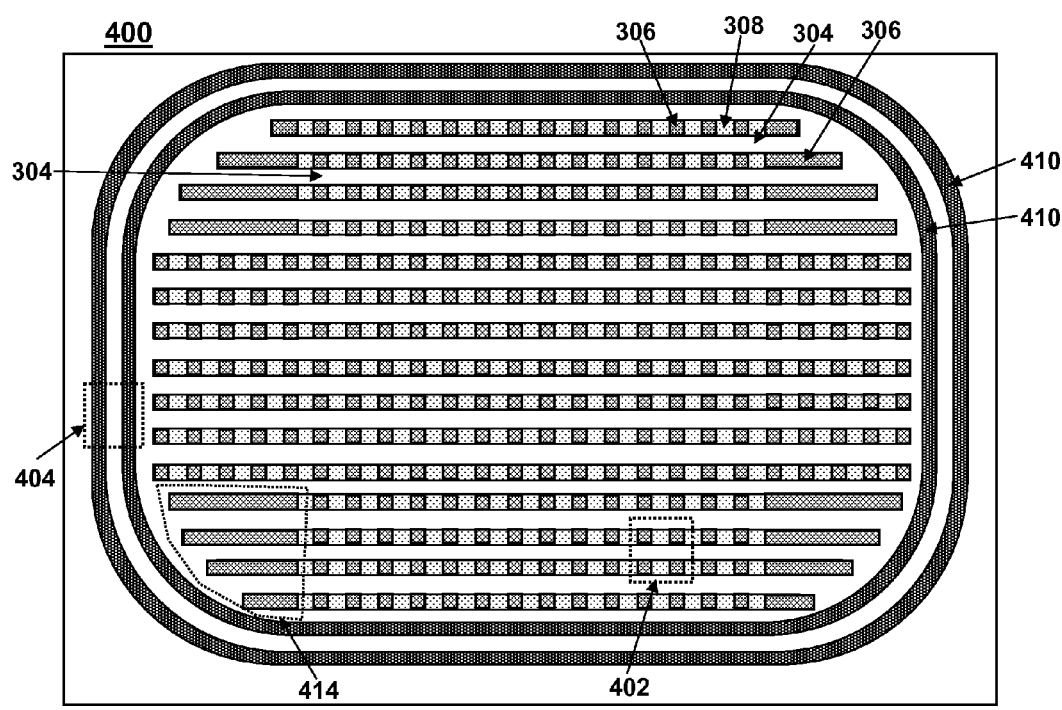
FIG. 4A is a top view diagram illustrating a portion of a semiconductor device that utilizes staggered column superjunction structures in active cell and termination regions according to an embodiment of the present invention.
Figure 4B:
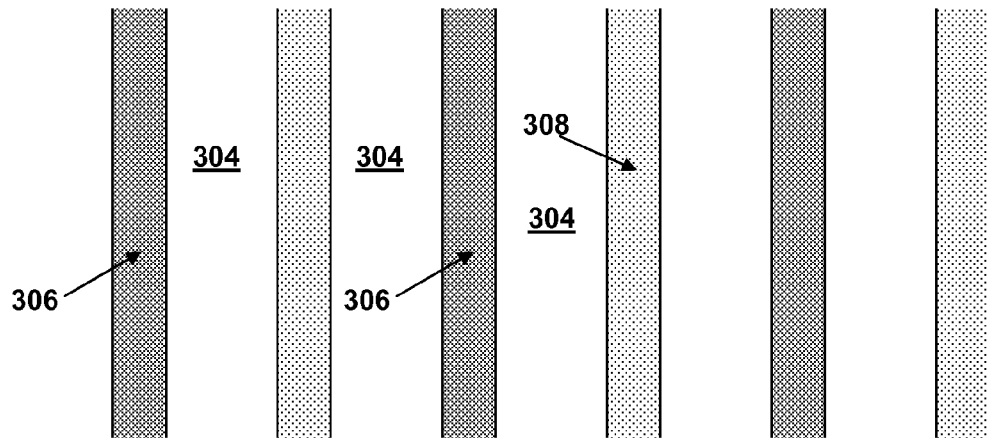
FIGS. 4B-4C are top views illustrating alternative layouts of the staggered columns.
Figure 4C:
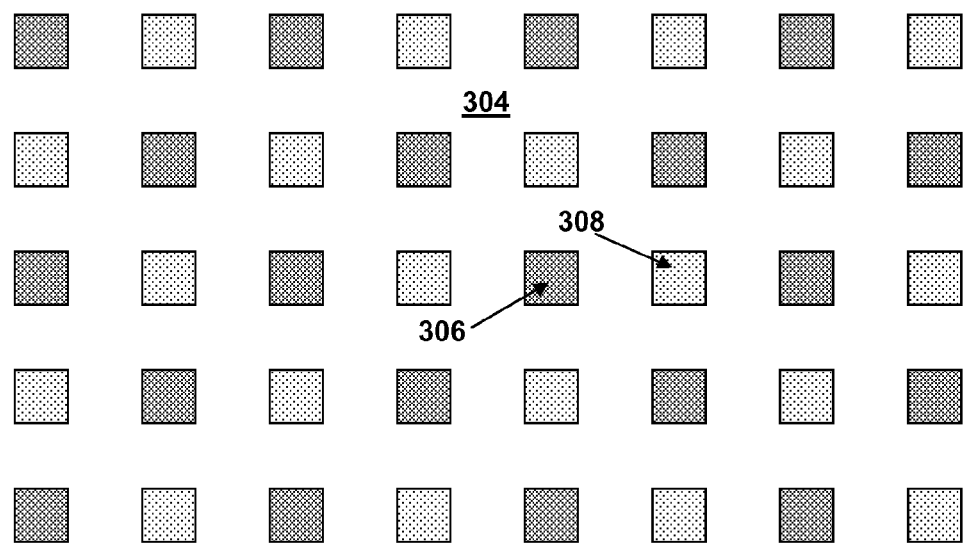
Figure 4D:
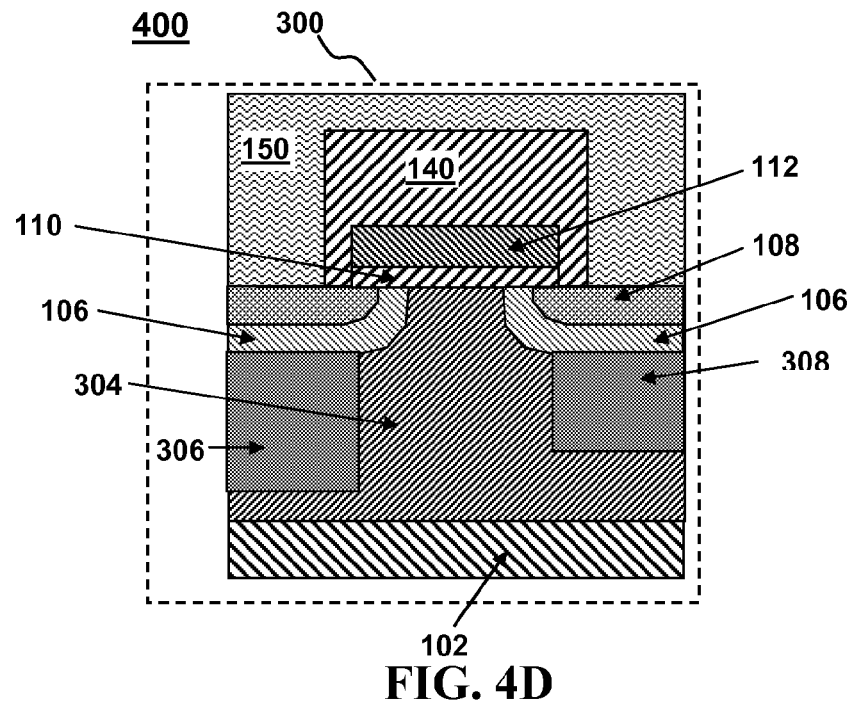
FIGS. 4D-4E are cross-sectional view diagrams illustrating a portion of a semiconductor device that utilizes staggered column superjunction structures in active cell and termination regions according to an embodiment of the present invention.

By using staggered superjunction devices and non-staggered (i.e., conventional) superjunction structures on a common device die, it is possible to adjust the tradeoff between BV and $R_{ds\text{-}on}$ for different parts of the die. By way of example, and not by way of limitation, FIG. 4A illustrates a possible layout of a semiconductor device 400 that utilizes staggered column superjunction structures in active cells and termination regions. The device 400 may be formed in layers on a semiconductor substrate. Selected portions of layer may be patterned or doped with ions to form a plurality of active cells 402 and termination regions 404. Only the superjunction columns are shown in the layout of FIG. 4A other features such as metal layers, oxides, source and body regions are omitted for the sake of clarity. As seen in FIG. 4D, the active cells 402 may include one or more staggered cell superjunction transistor devices 300 of the type described above with respect to FIGS. 3A-3B. The P type columns 306 may be deeper than columns 308, and the two P-type columns may alternate within a row in the active cells region 402. The portions of the N-type epitaxial layer 304 located adjacent to the P-type columns 306, 308 form N-type columns which are charge balanced with the P-type columns 306, 308. A source metal 150 may make contact to the source regions 108 through openings in a borophososilicate glass BPSG layer 140. The termination regions 404 may include superjunction structures 406 shown in cross-section in FIG. 4E. The superjunction transistor devices 300 and termination region superjunction structures may be formed on a common substrate 102, which may act as a drain for devices in the active cells 402 and termination regions 404. As seen in FIG. 4A, the doped columns that form the superjunction structures 406 in the termination regions may extend around the area of the active cells 402. FIGS. 4B and 4C show alternative layouts for the staggered P columns 306, 308 within the active cells. In FIG. 4B, the staggered P columns 306, 308 form uninterrupted alternating parallel rows. In FIG. 4C, the staggered P columns 306, 308 are in an alternating checkered pattern.

Figure 4E:
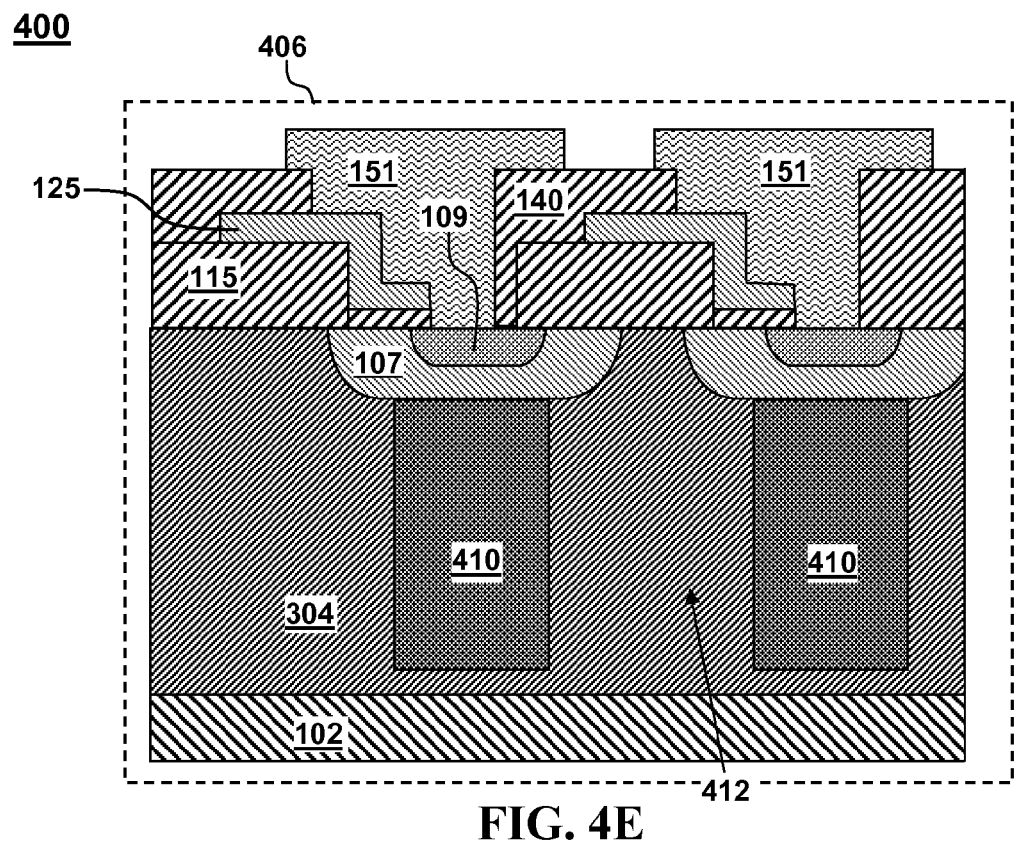

As seen in FIG. 4E, the superjunction structures 406 in the termination regions 404 may include a P-type region 107, an N+ region 109 and one or more P-type columns 410 and N-type columns 412. The N-type columns 412 may comprise of the portions of the N-type epitaxial layer 304 that are situated adjacent to the P-type columns 410. The termination structure may also include field 115 oxides, field plates 125, BPSG 140, and floating termination metal 151. While this is just an example of a possible termination region, which is well known in the art, it is noted that the more important aspect of this figure is that the P-type columns 410 in the termination region 404 are full length and thus attain a higher BV than the staggered P-type columns 306, 308 of the active cells 402. However, this may not necessarily be the case in other examples that are within the scope of the present invention. In this example, the P-type columns 410 in the termination region superjunction structures 406 are not staggered. Instead, P-type columns 410 are formed to a uniform depth. This depth may be a full depth, e.g., 7 units. The P-type columns 306, 308 of the superjunction devices 300 in the active cells 402, by contrast may be formed to staggered depths, e.g., 6 units and 7 units. This allows the device 400 to be designed with a higher BV in the termination region 404 and a lower BV but also lower $R_{ds\text{-}on}$ in the active cells 402. With higher BV in the termination region 404 UIS may be stabilized without having to increase $R_{ds\text{-}on}$ in the active cells 402.

In some embodiments, UIS may be similarly stabilized by making superjunction devices in active cells in corner regions 414 (see FIG. 4A) with full-depth alternating columns, just like the termination regions, e.g., as shown in FIG. 2, while the remaining active cell regions have staggered depth alternating columns. Because of its inherent geometric bends, the electric field of the active cell corner regions tends to be higher than in the rest of the active cell, which lowers the breakdown voltage—forming full-depth alternating columns in the corner regions 414 can mitigate this effect.

Fabrication of Staggered Superjunction Devices

Embodiments of the present invention include methods for fabricating staggered superjunction structures and devices of the types described above. FIGS. 5A-5M are cross-sectional and top views illustrating an example of a process of making a staggered column superjunction devices according to an embodiment of the present invention. Such a method may be used in fabricating devices of the types depicted in FIGS. 3A-3B and 4A-4B.

Figure 5A:
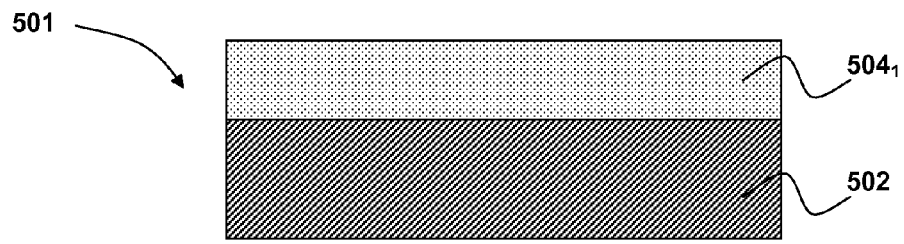
FIGS. 5A-5O are cross-sectional and top views illustrating a method of making a superjunction MOSFET device according to an embodiment of the present invention.

As shown in FIG. 5A, a starting material to form active cells 501 may include a N+ substrate 502 and a first N-Epi layer $504_1$ formed on top of the N+ substrate 502. The N+ substrate 502 may include dopants, such as Arsenic in sufficient quantity to provide a resistivity of 3 to 5 mOhm-cm or lower if available and may have <100> orientation with a standard prime. The first N-Epi layer $504_1$ may have a thickness of about 5 μm to 15 μm and a low doping concentration of about $5\times10^{14}/cm^3$ to $5\times10^{15}/cm^3$, preferably about $2\times10^{15}/cm^3$ for 500-600V applications. N-type dopant, e.g., phosphorus with a total charge of about $1\times10^{12}/cm^2$ to $3\times10^{12}/$ cm$^2$, may be in-situ doped into the N-Epi layer $504_1$ as the N-Epi layer $504_1$ is being formed, e.g., epitaxially grown.

Figure 5B:
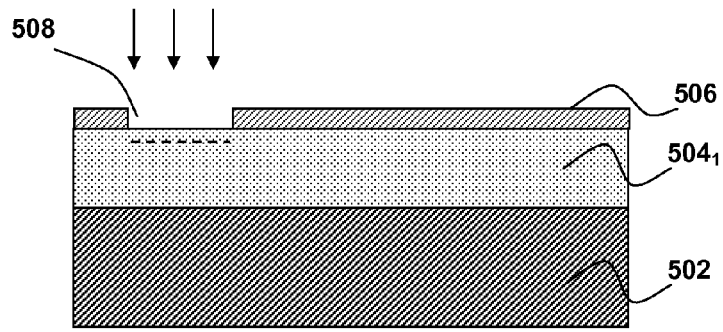
Figure 5C:
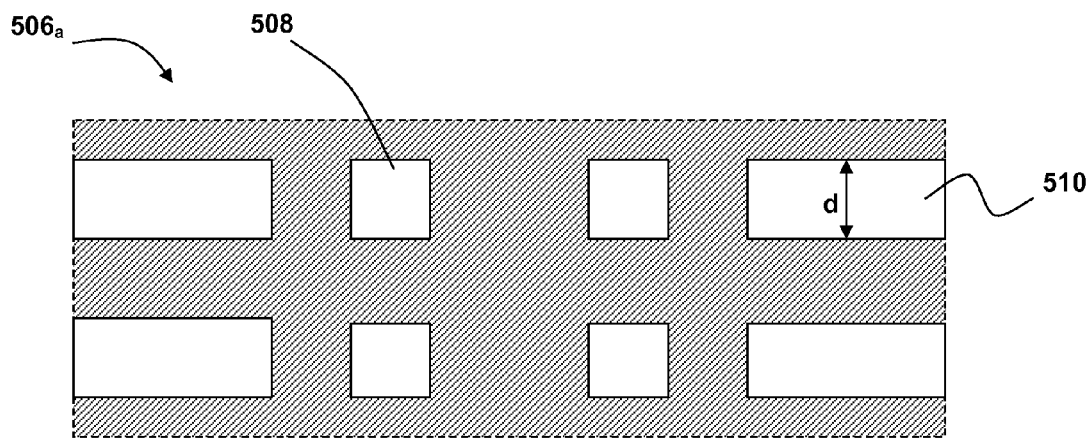
Figure 5D:
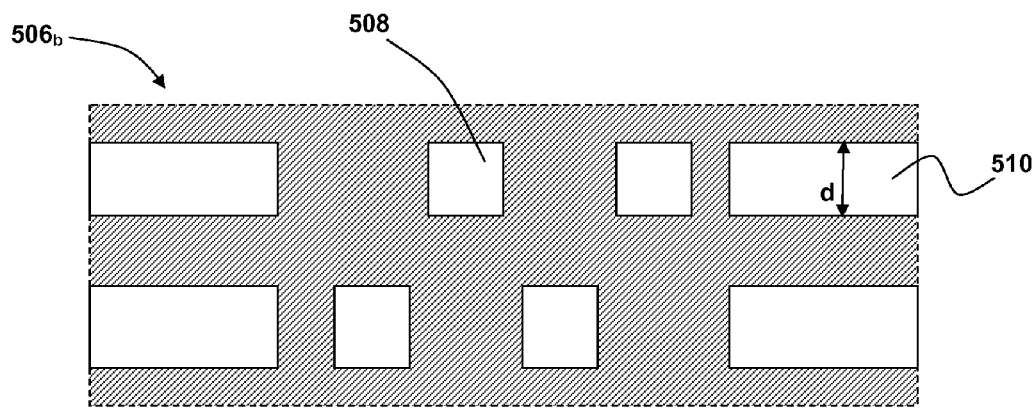
Figure 5E:
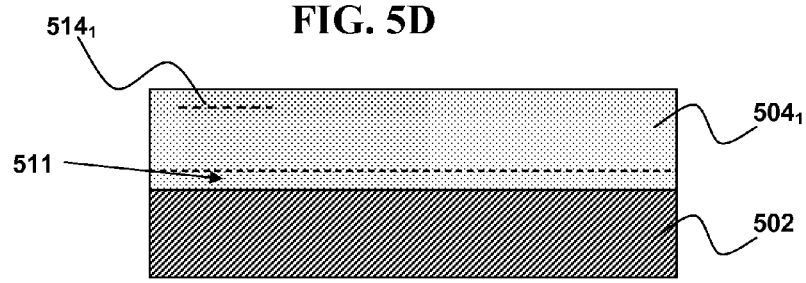

A first mask 506 is applied on top of the first N-type layer $504_1$ for P-type dopant implantation as shown in FIG. 5B. FIGS. 5C and 5D are top views of two alternative masks $506_a$ and $506_b$. As shown in FIGS. 5B-5D, each of the masks $506_a$ and $506_b$ contains openings 510, which can be positioned at the corners or termination regions (not shown), and openings 508, which can be positioned on the active cell region 501. A width d of the openings 508 and 510 may be about 3 μm. The openings 508 are patterned such that each opening 508 is positioned such that the final structure P-columns will be formed with staggered depths. The openings 508 are only positioned where the full-depth P columns will be formed. P-type dopants, e.g., boron with a dosage of about $5\times10^{12}$/cm$^2$, are implanted on the first N-type layer $504_1$ through the openings 508 and 510 to form first P-type implant region $514_1$ as shown in FIG. 5E. An N-type buffer 511 may optionally be located in the space between the P-type implant region $514_1$ and the substrate 502.

Figure 5F:
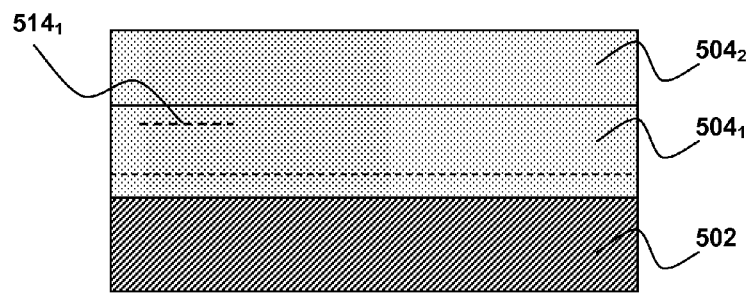
Figure 5G:
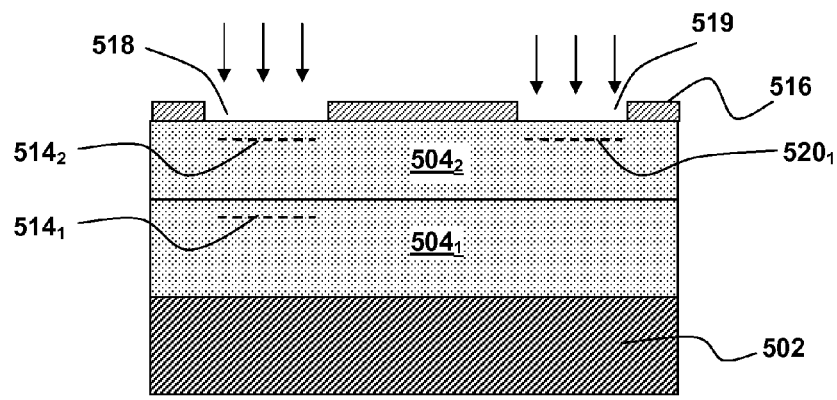
Figure 5H:
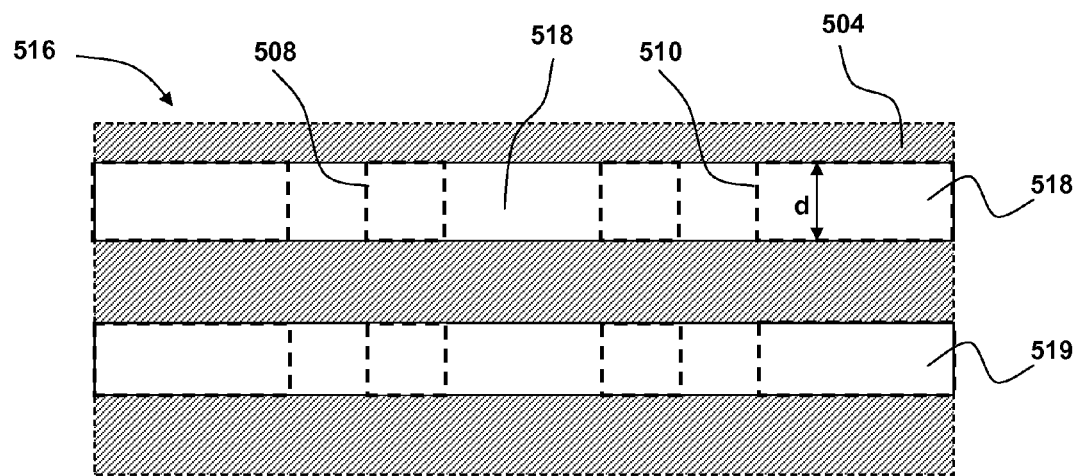
Figure 5I:
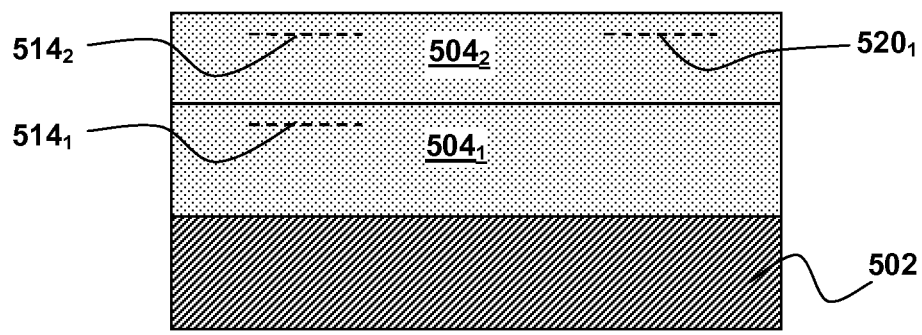

As shown in FIG. 5F, a second N-Epi layer $504_2$ is formed on the first N-type layer $504_1$. A second mask 516 is then applied on top of the structure N-type layer $504_2$ for P-type dopant implantation as shown in FIG. 5G. FIG. 5H is a top view of the second mask 516. As shown in FIG. 5F, the masks 516 have openings 518, 519 for both the termination regions 503 and the active cell regions 501. The openings 518, 519 can have the same width d as the first mask. The openings 518 and 519 are patterned where any of the P-columns (whether full-depth or not) are to be located as shown in FIG. 5G. FIG. 5G also shows the location of the dashed-line outline of the mask openings 508 and 510 of FIG. 5C. P-type dopants are implanted on the second N-type layer $504_2$ through the openings 518, 519 to form the P-type implant regions $514_2$ and $520_1$ as shown in FIG. 5I.

Figure 5J:
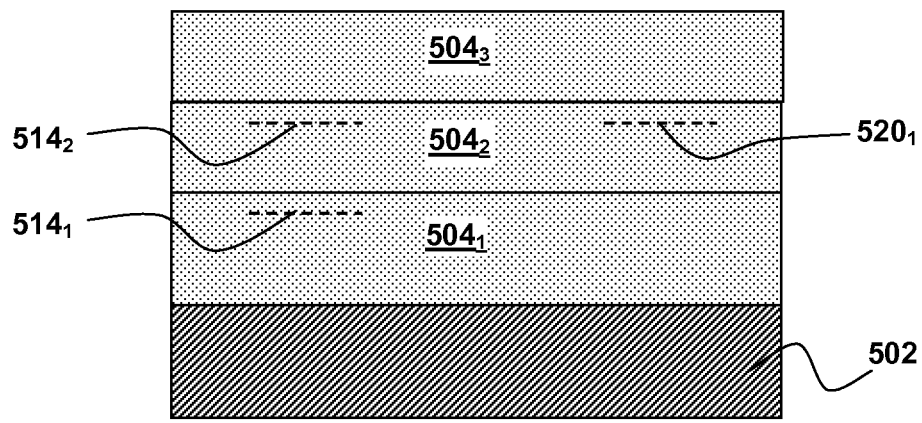
Figure 5K:
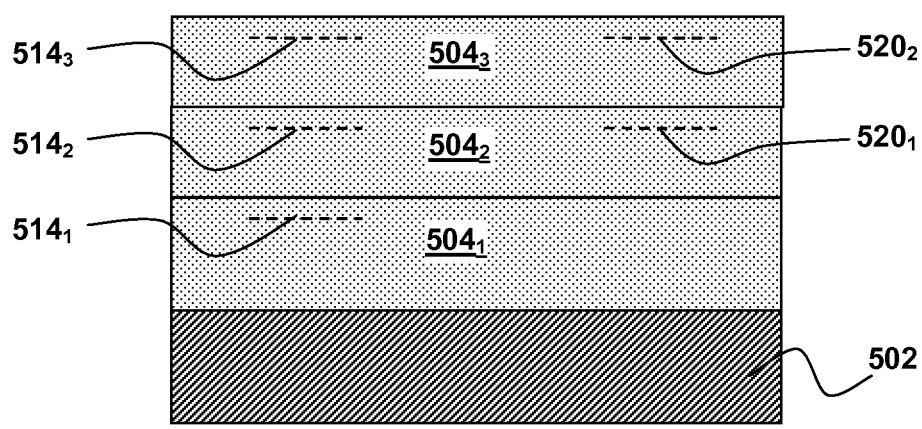

FIGS. 5J-5K are cross-sectional views showing the steps that are similar to the steps shown in FIGS. 5F-5I. As shown in FIG. 5J, a third N-Epi layer $504_3$ is formed on the second N-type layer $504_2$. The same second mask 516 is then applied on top of the structure N-type layer $504_3$ for P-type dopant implantation (not shown). P-type dopants are implanted on the third N-type layer $504_3$ through the openings 518, 519 and then diffused to form the P-type region $514_3$ and $520_2$ as shown in FIG. 5K.

Figure 5L:
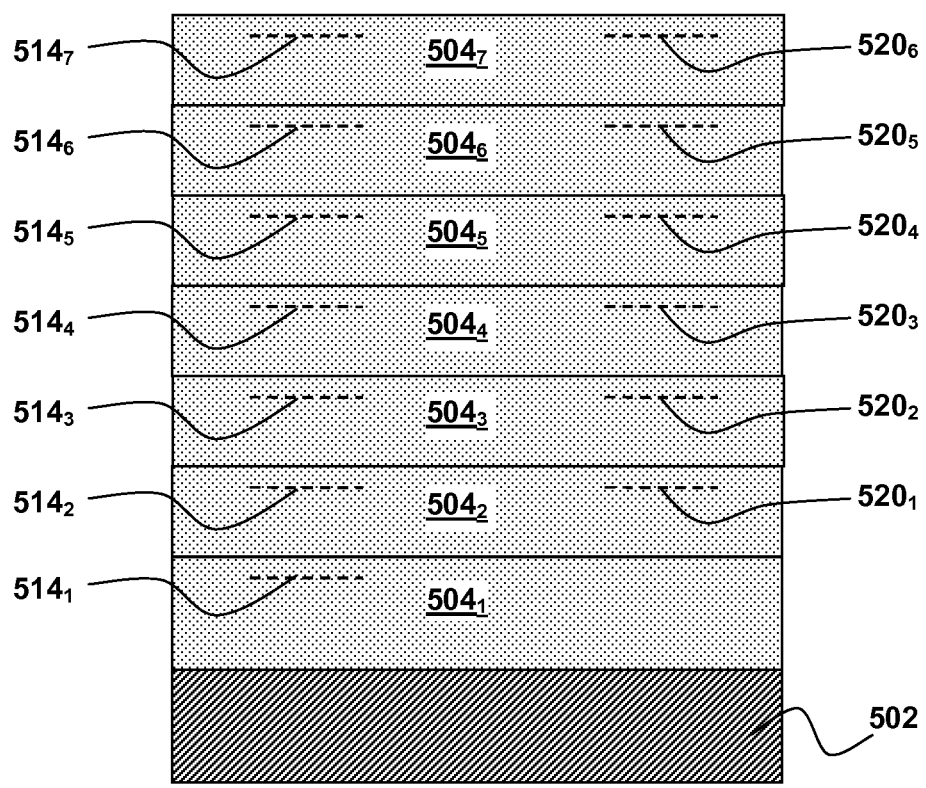
Figure 5M:
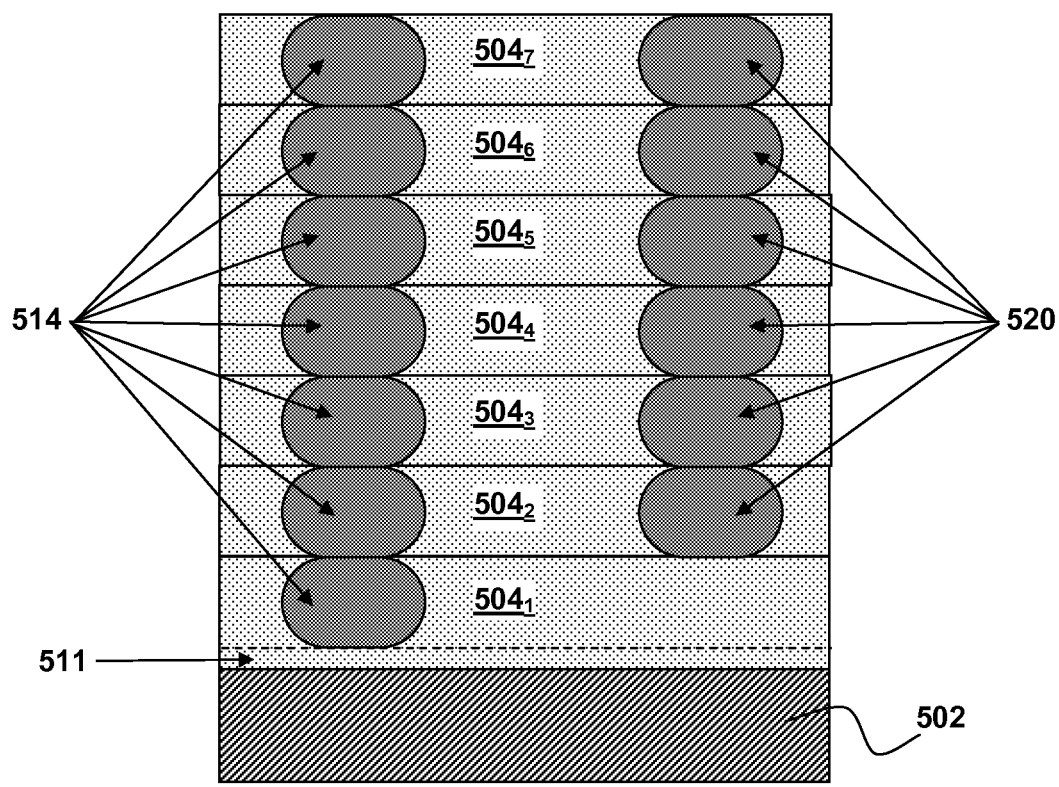

The steps depicted in FIGS. 5F-5I may then be repeated multiple times, e.g., 3-5 more times, depending on the thickness of each N-Epi layers $504_1$, $504_2$, etc, and the breakdown voltage desired. FIG. 5L is a cross-sectional view of an embodiment having 7 N-Epi layers $504_1$-$504_7$ and P-type implant regions $514_1$-$514_7$ and $520_1$-$520_6$. A diffusion process may now be carried out to diffuse out all the P-type implants into P-type regions forming up the P-type columns 514 and 520. FIG. 5M is a cross-sectional view illustrating the structure of the staggered column superjunction with the P-column 514 having 7 units depth and the P-column 520 having 6 units depth. The termination region may also be implanted with all its columns at a full depth of 7 units (not shown). As such, the BV at the termination region is higher than the BV in the active cell region, which results in better UIS performance. The staggering of the depths of the P-columns 514, 520 also lowers the $R_{ds\text{-}on}$ in the cell region compared to having all full depth columns. Furthermore, at the corners of the active region, the electric field tends to be larger and BV is lower, which can be compensated by using all full depth column implantation in this part of the active cell region. In addition, by adjusting the layout of the first P-type region $514_1$ it is easy to adjust the break down voltage BV, Rdson and UIS performance. Optionally, the properties of first P-type region $514_1$ can also be varied to adjust the BV, $R_{ds\text{-}on}$, etc. By way of example, and not by way of limitation, the first P-type region $514_1$ may be formed wider, or less wide, or deeper, or less deep, or with different doping concentration than the other P-type regions $514_2$, etc.

Figure 5N:
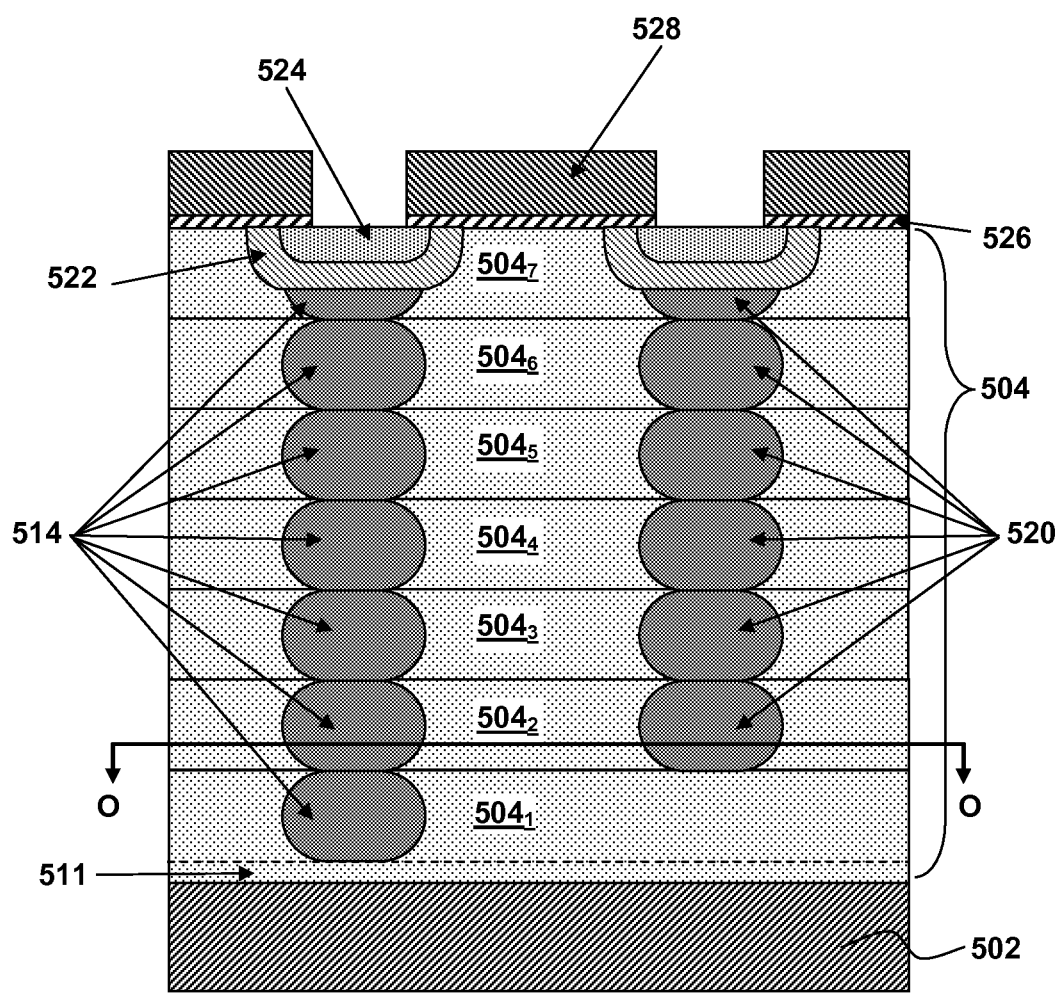

P-body regions 522, N+ source regions 524, a N+ polysilicon gate region 528 and a gate oxide 526 disposed under the N+ gate 528 may be formed with standard methods to complete the staggered column superjunction MOSFET device 530 as shown in FIG. 5N. An N-type optional buffer region 511 may be located between the bottom of the full depth P-column 514 and the N+ substrate 502.

Figure 5O:
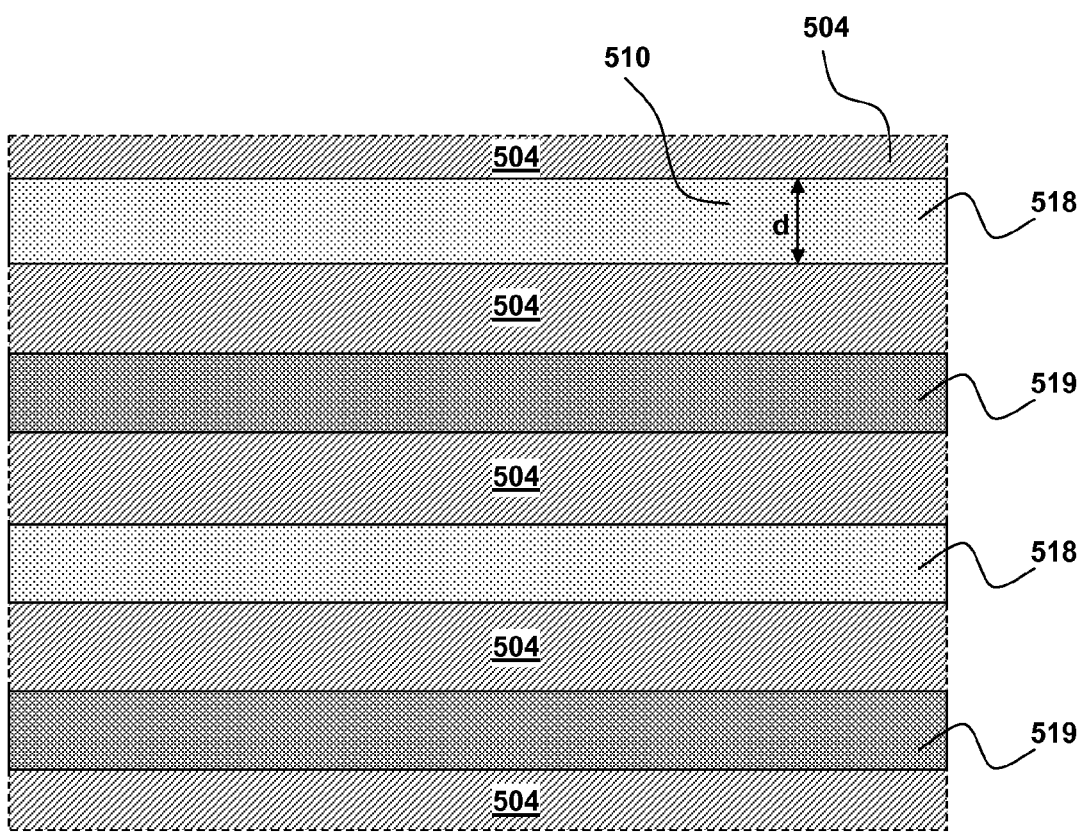

FIG. 5O is a top view cross-section of another possible layout configuration taken along line O-O in FIG. 5N, showing the full depth P-columns 514 staggered with partial depth P-columns 520 with N-Epi 504 in between.

FIG. 6A is a cross-sectional of a superjunction structure 600 that is formed by depositing 7 N-epi layers with 7 time implantation of P-type dopants. As shown in FIG. 6A, both P columns 602 are 7 units depth.

FIG. 6B is a cross-sectional view of a staggered superjunction structure 610 of the type depicted in FIG. 4 and FIG. 5L. As shown in FIG. 6B, a first P column 614 are 7 units depth, but the P column 612 are only 6 units depth.

FIG. 6C is a cross-sectional of a superjunction structure 620 that is formed by depositing 7 N-epi layers with 6 time of implantation of P-type dopants. As shown in FIG. 6A, both P columns 622 are 6 units depth.

Figure 7A:
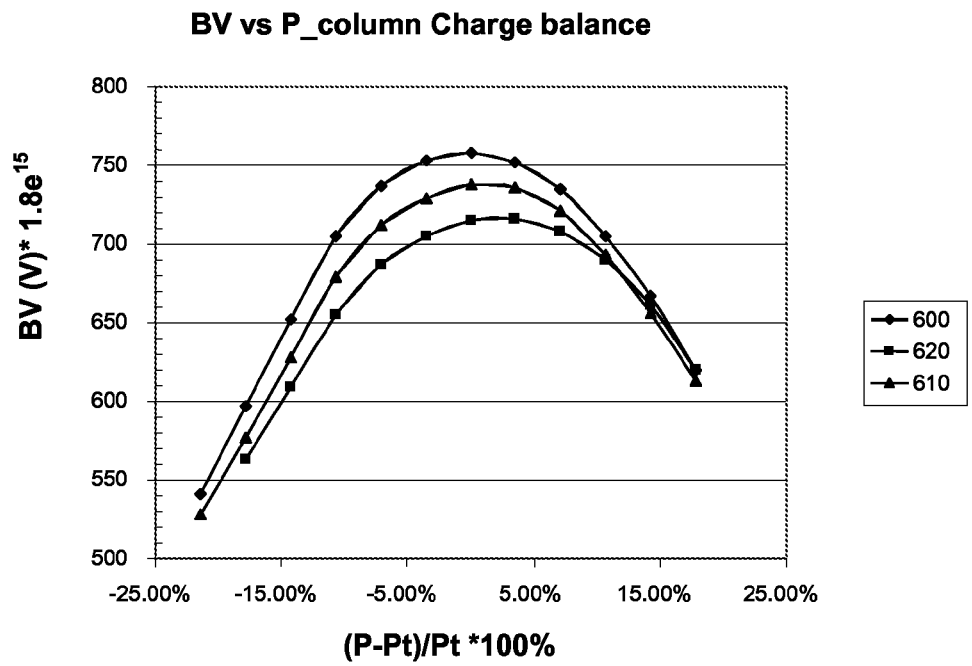
FIG. 7A is a graph of a BV vs P-column charge balance of three different types superjunction depicted in FIGS. 6A-6C.
Figure 7B:
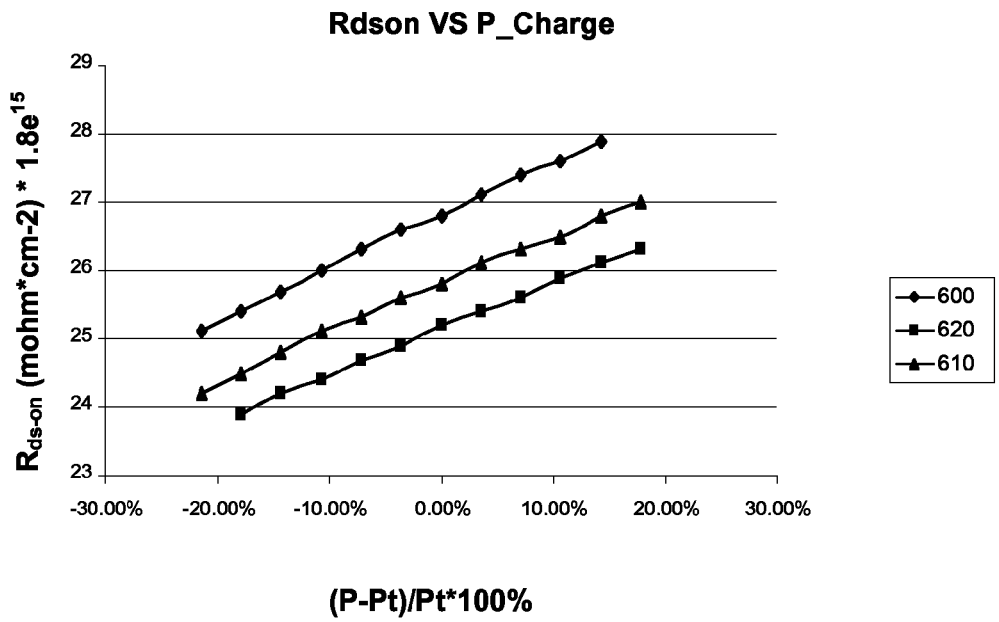
FIG. 7B is a graph of $R_{ds\text{-}on}$ vs P-charge of three different types of superjunction depicted in FIGS. 6A-6C.

FIG. 7A are plots of BV versus P column charge balance of three different types of superjunction structures depicted in FIGS. 6A-6C. FIG. 7B are plots of $R_{ds\text{-}on}$ versus P column charge balance of three different types of superjunction structures depicted in FIGS. 6A-6C.

As shown in FIGS. 7A-7B, with the same P column doping concentration, the superjunction structure 600 (with full-depth columns) results in high BV and also high Rdson. The superjunction structure 620 (with lesser-depth columns) results in low BV and also low Rdson. Only the staggered column superjunction structure 610 of the present invention give a middle BV and $R_{ds\text{-}on}$, which may be an ideal compromise when it is desired to have lower BV, in a certain region, but not too low.

While the above is a complete description of the preferred embodiment of the present invention, it is possible to use various alternatives, modifications and equivalents. For example, the conductivity types may be reversed, or the MOSFET may be replaced with another device such as a diode, or an insulated gate bipolar transistor (IGBT). Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. Any element in a claim that does not explicitly state "means for" performing a specified function, is not to be interpreted as a "means" or "step" clause as specified in 35 USC §112, ¶6. In particular, the use of "step of" in the claims herein is not intended to invoke the provisions of 35 USC §112, ¶6.

Although the present invention has been described in considerable detail with reference to certain preferred versions thereof, other versions are possible. Therefore, the spirit and scope of the appended claims should not be limited to the description of the preferred versions contained herein.

The reader's attention is directed to all papers and documents which are filed concurrently with this specification and which are open to public inspection with this specification, and the contents of all such papers and documents incorporated herein by reference.

All the features disclosed in this specification (including any accompanying claims, abstract and drawings) may be replaced by alternative features serving the same, equivalent or similar purpose, unless expressly stated otherwise. Thus, unless expressly stated otherwise, each feature disclosed is one example only of a generic series of equivalent or similar features.

What is claimed is:

1. A staggered column vertical superjunction semiconductor device comprising:
    a cell region having one or more device cells, wherein a portion of the device cells in the active cell region include:
        a first semiconductor layer of a first conductivity type;
        a second semiconductor layer of the first conductivity type located on top of the first semiconductor layer; and
        a plurality of first doped columns formed in the second semiconductor layer to a first depth and a plurality of second doped columns formed in the second semiconductor layer to a second depth, wherein the first depth is greater than the second depth, wherein the first and second doped columns are doped with dopants of a same second conductivity type that is different from the first conductivity type and wherein the first and second doped columns extend along a portion of a thickness of the second semiconductor layer, wherein the first and second doped columns alternate with each other in a row, wherein depths of alternate first and second doped columns within the row alternate between deeper and shallower, and wherein the first and second columns are adjacent to portions of the second semiconductor layer of the first conductivity type.

2. The semiconductor device of claim 1 wherein the first and second doped columns are doped such that the columns of the first conductivity type are substantially horizontally charge balanced with the adjacent portions of the second semiconductor layer.

3. The semiconductor device of claim 1, wherein the first conductivity type is N-type.

4. The semiconductor device of claim 1, wherein the first conductivity type is P-type.

5. The semiconductor device of claim 1, wherein the second depth is approximately 5/6 or 6/7 of the first depth.

6. The semiconductor device of claim 1 further comprising termination regions, wherein the termination regions have one or more doped columns of the second conductivity type formed to the first depth in a second semiconductor layer of the first conductivity type.

7. The semiconductor device of claim 1 further comprising termination region, wherein the termination region includes doped columns of the second conductivity type, wherein all the doped columns of the second conductivity type in the termination region extend to the first depth.

8. The semiconductor device of claim 1 wherein the first column is deeper than the second column by about 5-15 microns.

9. The semiconductor device of claim 1, wherein all the doped columns of a second conductivity type in a corner of the active cell region extend to the first depth.

10. A vertical superjunction device comprising:
    a plurality of columns of a second conductivity type alternating with one or more columns of a first conductivity type in a semiconductor substrate of the first conductivity type;
    wherein one or more of the columns of the second conductivity type in a main portion of the device have a depth less than a depth of columns of the second conductivity type in a termination portion of the device, and wherein the columns of the second conductivity type are horizontally charge balanced with the columns of the first conductivity type.

11. A vertical superjunction device comprising:
    a plurality of columns of a second conductivity type alternating with one or more columns of a first conductivity type;
    wherein the columns of the second conductivity type are characterized by staggered depths,
    wherein depths of alternate columns of the second conductivity type within a row of columns of the second conductivity type alternate between deeper and shallower, and wherein the columns of the second conductivity type are horizontally charge balanced with the columns of the first conductivity type.

* * * * *